(12) United States Patent
Kadota

(10) Patent No.: US 6,291,257 B1
(45) Date of Patent: Sep. 18, 2001

(54) SEMICONDUCTOR PHOTONIC DEVICE HAVING A ZNO FILM AS A BUFFER LAYER AND METHOD FOR FORMING THE ZNO FILM

(75) Inventor: Michio Kadota, Kyoto (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/342,607

(22) Filed: Jun. 29, 1999

(30) Foreign Application Priority Data

Jul. 21, 1991 (JP) .................................................. 10-205391

(51) Int. Cl.$^7$ .............................. H01L 21/00; H01L 33/00
(52) U.S. Cl. ................................................. 438/46; 257/94
(58) Field of Search .................................. 438/46, 47, 93, 438/94, 478, 873; 257/13, 94, 96, 97, 101, 102, 103, 458; 117/101, 105, 952; 372/45, 46

(56) References Cited

U.S. PATENT DOCUMENTS 5,670,798    9/1997   Schetzina .............................. 257/96

FOREIGN PATENT DOCUMENTS

19629720 A1 * 2/1997 (DE) .

OTHER PUBLICATIONS

Patent Abstracts of Japan; Publication No.10178202A; Published 6/30/98.*

* cited by examiner

*Primary Examiner*—Keith Christianson
(74) *Attorney, Agent, or Firm*—Ostrolenk, Faber, Gerb & Soffen, LLP

(57) ABSTRACT

A semiconductor photonic device contains a substrate: a ZnO buffer layer; and a compound semiconductor layer represented by $In_xGa_yAl_zN$ (where x+y+z=1, $0 \leq x \leq 1$, $0 \leq y \leq 1$, and $0 \leq z \leq 1$), wherein the ZnO buffer has a thickness of about 3,500 Å or more and is aligned in a c-axis direction.

4 Claims, 4 Drawing Sheets

SEMICONDUCTOR PHOTONIC DEVICE HAVING A ZNO FILM AS A BUFFER LAYER AND METHOD FOR FORMING THE ZNO FILM

BACKGROUND OF THE INVENTION

1. Field of the Invention

The present invention relates to semiconductor photonic devices and a method for forming a ZnO film. More particularly, the invention relates to semiconductor photonic devices using Group III-V compounds such as GaN, InGaN, GaAlN and InGaAlN. The invention also relates to a method for forming a ZnO film deposited on a substrate such as an Si substrate or a glass substrate.

2. Description of the Related Art

As materials for semiconductor photonic devices such as light emitting diodes (LEDs) and laser diodes (LDs) which emit blue light or ultraviolet light, III-V semiconductor compounds represented by the general formula $In_xGa_yAl_zN$ (where $x+y+z=1$, $0 \leq x \leq 1$, $0 \leq y \leq 1$ and $0 \leq z \leq 1$) are known. The semiconductor compounds have high light emission efficiency because they are of the direct gap type, and emission wavelengths can be controlled by the In content, and thus these semiconductor compounds have been receiving attention as materials for light emitting devices.

Since it is difficult to form a large single crystal of the $In_xGa_yAl_zN$, a so-called "hetero-epitaxial growth method" is used in which a crystal film is grown on a substrate of a different material, and generally it is grown on a c-plane sapphire substrate. However, c-plane sapphire substrates are expensive, and moreover, because of large lattice mismatching, many crystal defects at defect densities of $10^8/cm^2$ to $10^{11}/cm^2$ occur in the grown crystals, and thus it is not possible to obtain quality crystal films having excellent crystallinity, which is a problem.

In order to reduce lattice mismatching when $In_xGa_yAl_zN$ is grown on a c-plane sapphire substrate and to obtain crystals having few defects, a method has been developed in which a polycrystalline or amorphous AlN buffer layer or a low pressure growth GaN buffer layer is provided on the c-plane sapphire substrate. In accordance with this method, since lattice mismatching between the c-plane sapphire substrate and the buffer layer is reduced and at the same time lattice mismatching between the buffer layer and $In_xGa_y-Al_zN$ is reduced, a crystal film having few defects can be obtained. However, in addition to the expensive c-plane sapphire substrate in this method, the structure becomes complex, resulting in a further increase in cost.

Additionally, an SiC substrate has been investigated, and there is small lattice mismatching with the SiC substrate. However, SiC substrates are much more expensive in comparison with c-plane sapphire substrates (approximately 10 times as costly as c-plane substrates), which is disadvantageous.

Accordingly, it has been conventionally desired that semiconductor photonic devices be fabricated using inexpensive Si substrates or glass substrates. For that purpose, an $In_xGa_yAl_zN$-based light emitting device may be constructed by depositing a ZnO film (buffer layer) having a hexagonal system oriented in the c-axis direction on an Si substrate or glass substrate and by forming a semiconductor containing GaN thereon.

When a ZnO buffer layer is provided on an Si substrate, the substrate cost can be limited to approximately one-tenth of that of a c-plane sapphire substrate, enabling low cost. Additionally, while a c-plane sapphire substrate is an insulating material, an Si substrate can be made conductive and a p-type electrode and an n-type electrode can be provided on the upper side and the lower side of the light emitting device, thus simplifying the structure of the device.

In the past, it was not possible, simply by forming a ZnO film oriented in the c-axis direction on an Si substrate, to grow a thin film containing GaN having good crystallinity thereon. Since the c-axis orientation of the ZnO film sensitively affects the crystallinity of the thin film containing GaN formed thereon, in order to form a thin film containing satisfactory GaN thereon, a ZnO film having the best possible c-axis orientation must be obtained.

SUMMARY OF THE INVENTION

The present invention is directed to a semiconductor photonic device that can solve the technical problems described above, and it is an object of the present invention to form a Zno film (ZnO buffer layer) having satisfactory c-axis orientation on a substrate so that a semiconductor layer containing satisfactory GaN can be grown thereon.

In a method for forming a ZnO film in accordance with the present invention, a ZnO film oriented in the c-axis direction is formed on a substrate, and by setting the film thickness at about 3,500 Å or more, a ZnO film having satisfactory rocking curve characteristics can be obtained.

In the present invention, in a semiconductor photonic device using a compound semiconductor represented by $In_xGa_yAl_zN$ (where $x+y+z=1$, $0 \leq x \leq 1$, $0 \leq y \leq 1$, and $0 \leq z \leq 1$), a ZnO buffer layer having satisfactory rocking curve characteristics is formed on a substrate by orienting a ZnO buffer layer having a thickness of about 3,500 Å or more in the c-axis direction, and a semiconductor layer containing GaN is formed on the ZnO buffer layer.

In accordance with the present invention, since the rocking curve half-width of the ZnO buffer layer oriented in the c-axis direction can be set at 4.5° or less, satisfactory c-axis orientation can be achieved and the semiconductor layer formed on the ZnO buffer layer can have satisfactory crystallinity.

More preferably, the thickness of the ZnO buffer layer is increased so that the ZnO buffer layer has a rocking curve half-width of 3.5° or less, and in particular, the rocking curve half-width is desirably set at 2.5° or less.

For the purpose of illustrating the invention, there is shown in the drawings several forms which are presently preferred, it being understood, however, that the invention is not limited to the precise arrangements and instrumentalities shown.

DETAILED DESCRIPTION OF THE INVENTION

Figure 1:
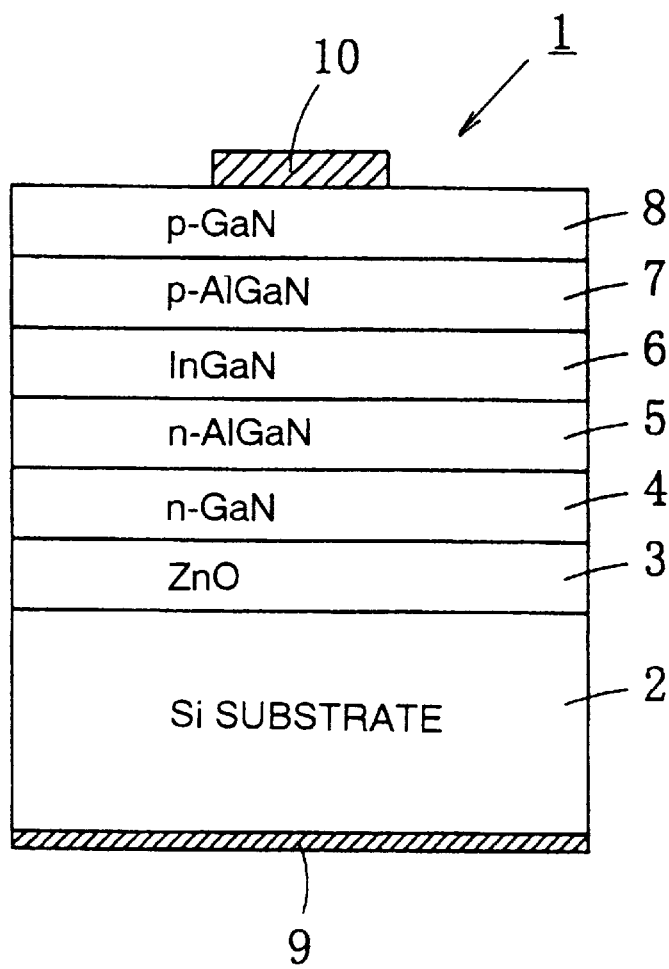
FIG. 1 is a sectional view which shows a structure of a semiconductor photonic device as an embodiment of the present invention.

Hereinafter, the preferred embodiments of the present invention are explained in detail with reference to the drawings. FIG. 1 shows a semiconductor photonic device 1 having a double hetero-junction structure as an embodiment of the present invention, such as a light emitting diode or a surface light emitting laser diode in which an InGaN layer 6 functions as a luminescent layer. In the semiconductor photonic device 1, a ZnO buffer layer 3 having low resistivity is deposited on a conductive Si substrate 2, and on the ZnO buffer layer 3, an n-type GaN layer 4, an n-type AlGaN layer 5, the InGaN layer 6 (luminescent layer), a p-type AlGaN layer 7 and a p-type GaN layer 8 are epitaxially deposited in that order. The n-type GaN layer 4, the n-type AlGaN layer 5, the InGaN layer 6 (luminescent layer), the p-type AlGaN layer 7 and the p-type GaN layer 8 constitute a double hetero-junction structure. Furthermore, an n-type electrode 9 is provided on the entire lower surface of the Si substrate 2 and a p-type electrode 10 is formed partially on the upper surface of the p-type GaN layer 8. Accordingly, when a voltage is applied between the p-type electrode 10 and the n-type electrode 9, an electric current is injected into the InGaN layer 6 from the p-type electrode 10 to emit light, and the light emitting from the InGaN layer 6 is emitted to the exterior from the region in which the p-type electrode 10 is not provided on the upper surface of the p-type GaN layer 8.

In the semiconductor photonic device 1, as described with reference to the conventional example, in order to obtain the n-type GaN layer 4 having good crystallinity, it is important that the ZnO buffer layer 3 formed on the Si substrate 2 has satisfactory c-axis orientation. Accordingly, the present inventor formed ZnO films having various film thicknesses on Si substrates ($SiO_2$/Si substrates) in which the surfaces thereof were oxidized and rocking curves thereof were measured.

Figure 2:
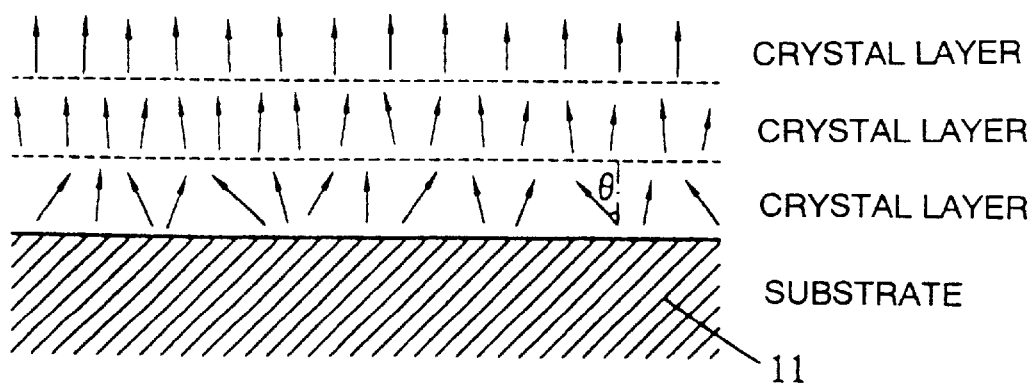
FIG. 2 is a diagram which illustrates changes in the directions of crystal axes of crystals grown on a substrate.

First, a rocking curve will be described. As shown in FIG. 2, when a ZnO film is grown on a substrate 11, although the directions of the crystal axes (shown by arrows) randomly vary due to lattice mismatching in relation to the substrate in a first crystal layer, as crystal layers are deposited, the directions of crystal axes are arranged in order. In order to evaluate the degree of randomness in the directions of crystal axes in thin films and crystals, a rocking curve is measured using an X-ray diffractometer. That is, X-rays are applied to a substrate to be measured and while changing the incident angle in relation to the substrate, reflected rays are detected by a detector.

Specifically, with the position of X-rays being fixed, a substrate to be measured is rotated about the axis of rotation which is parallel to the substrate so that the normal of the substrate changes its direction, and at the same time the position of the detector is also rotated in response to the rotation of the substrate so as to receive rays which have been regularly reflected from the substrate. In this way, while changing the angle of the substrate to be measured, intensities of reflected rays are detected. An angle between the incident ray and the reflected ray when the output of the detector reaches its peak is designated as $2\theta_p$, and in ZnO oriented in the c-axis direction, the output reaches the peak at $2\theta_p$ of 34.4°. Next, the position of X-rays is fixed and the detector is fixed at the peak position, and then X-ray intensities are measured while the substrate alone is rotated in the vicinity thereof.

Figure 3:
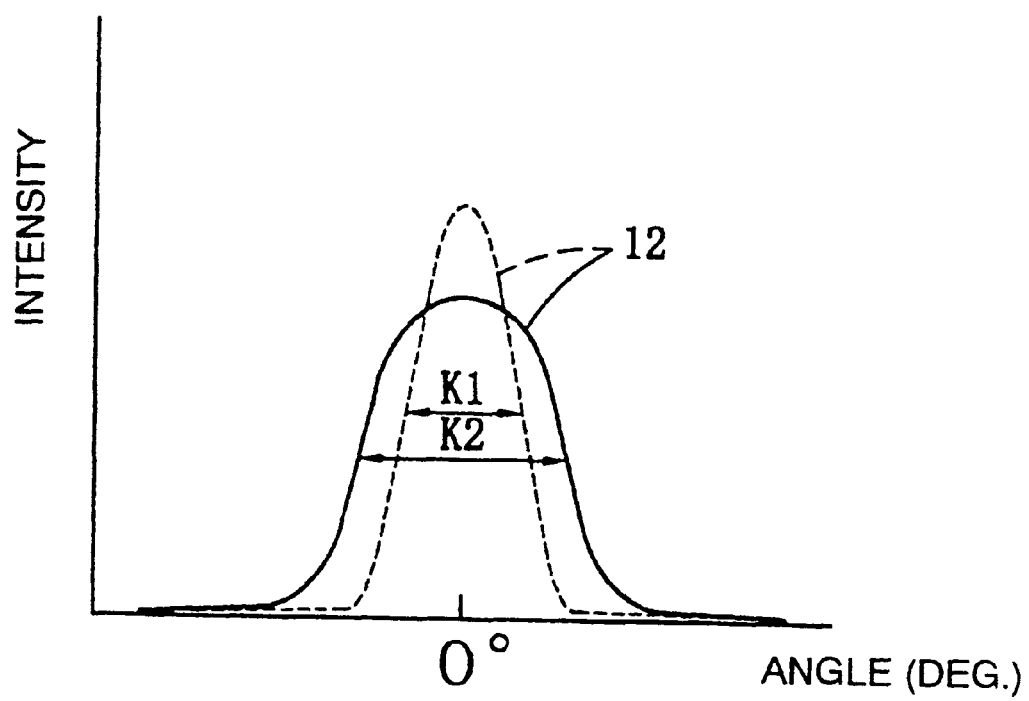
FIG. 3 is a schematic representation of a rocking curve.

The distribution of X-ray intensities obtained as described above is a rocking curve and the position at which the detector is fixed is $\theta_p$=17.2°. A deviation of the measured peak of the rocking curve from 17.2° corresponds to the inclination of the c-axis. The distribution of X-ray intensities represented using relative angles when 0° is substituted for the peak position (17.2°) is the rocking curve 12 as shown in FIG. 3. In FIG. 3, the horizontal axis shows the angle (inclination) of the c-axis and the vertical axis shows the intensity. The orientation of a crystal deposited on the substrate 11 can be evaluated by the half-width (full width at half maximum, referred to as FWHM) of the rocking curve 12. That is, when there are large deviations in crystal axis orientations, as shown by the solid line in FIG. 3, the rocking curve 12 varies gently and the half-width K2 thereof broadens. In contrast, when the crystal axis orientations are unified, as shown by the broken line in FIG. 3, the rocking curve 12 varies steeply and the half-width K1 thereof narrows.

Figure 4:
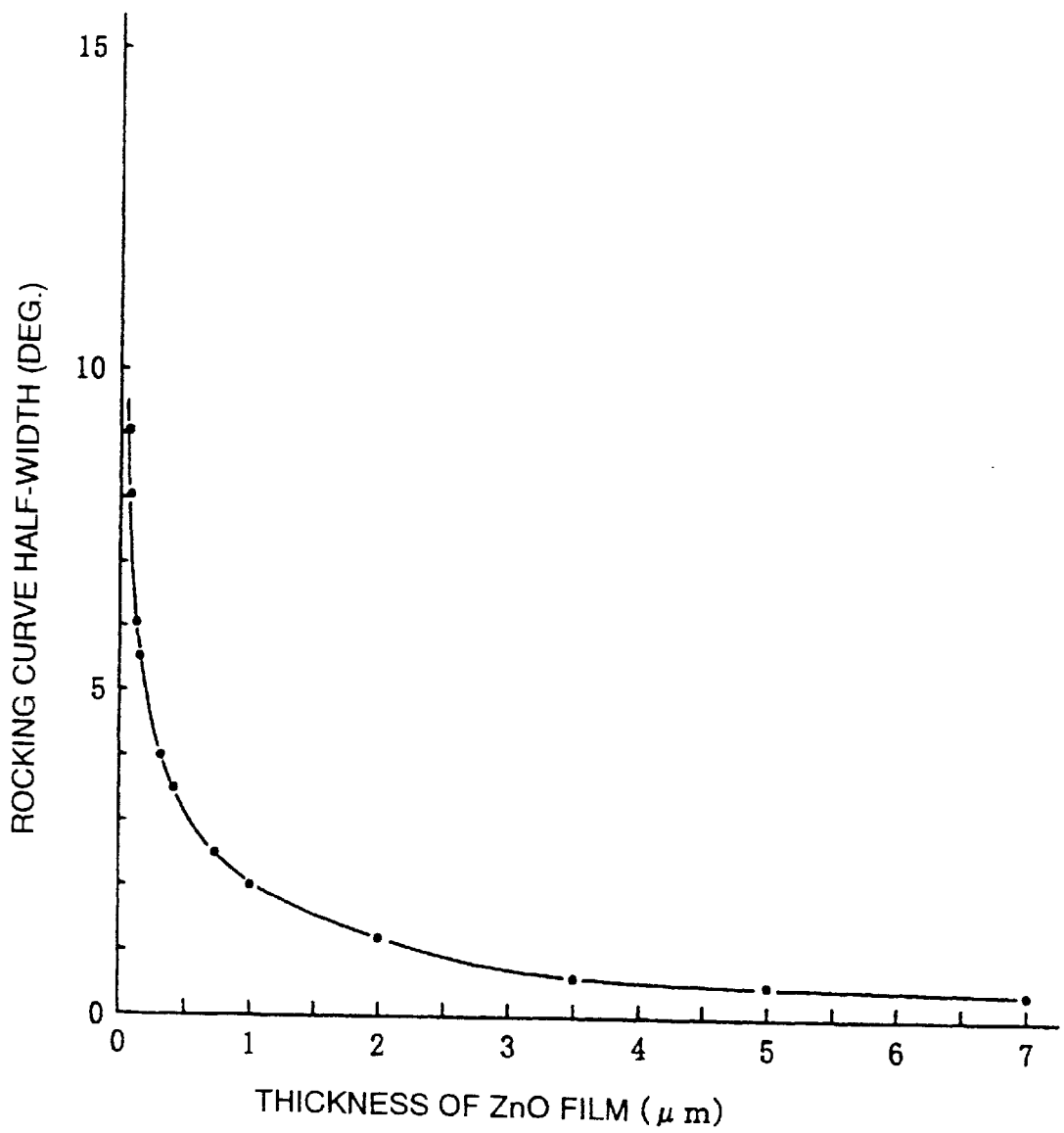
FIG. 4 is a graph showing a relationship between the thickness of a ZnO buffer layer formed on an Si substrate and the rocking curve half-width.

FIG. 4 summarizes measurement results of the relationship between the thickness of a ZnO film and the rocking curve half-width with respect to the c-axis orientation of the ZnO film when the ZnO film is deposited on an Si substrate ($SiO_2$/Si substrate). As is clear from FIG. 4, when the thickness of the ZnO film is increased to 0.35 μm (3,500 Å) or more, the rocking curve half-width is steeply decreased to 4.5° or less. In particular, the thickness of the ZnO film is preferably set at 0.5 μm (5,000 Å) or more, and thus the rocking curve half-width is decreased to 3.5° or less, and more preferably, by setting the thickness of the ZnO film at 0.7 μm (7,000 Å) or more, the rocking curve half-width is decreased to 2.5° or less, and thus a practical value can be obtained.

Therefore, when the semiconductor photonic device 1 is fabricated, by setting the thickness of the ZnO buffer layer 3 formed on the Si substrate 2 at about 3,500 Å or more, preferably at about 5,000 Å or more, and more preferably at about 7,000 Å or more, a ZnO buffer layer 3 having satisfactory c-axis orientation can be formed, and on the ZnO buffer layer 3, the n-type GaN layer 4 having satisfactory crystallinity can be grown by an MOCVD process or MBE process.

Although the Si substrate in which the surface thereof is oxidized is used in the embodiment described above, a ZnO film oriented in the c-axis direction having the same quality also may be obtained on an Si substrate in which the surface is not oxidized.

(Other Embodiments)

Figure 5:
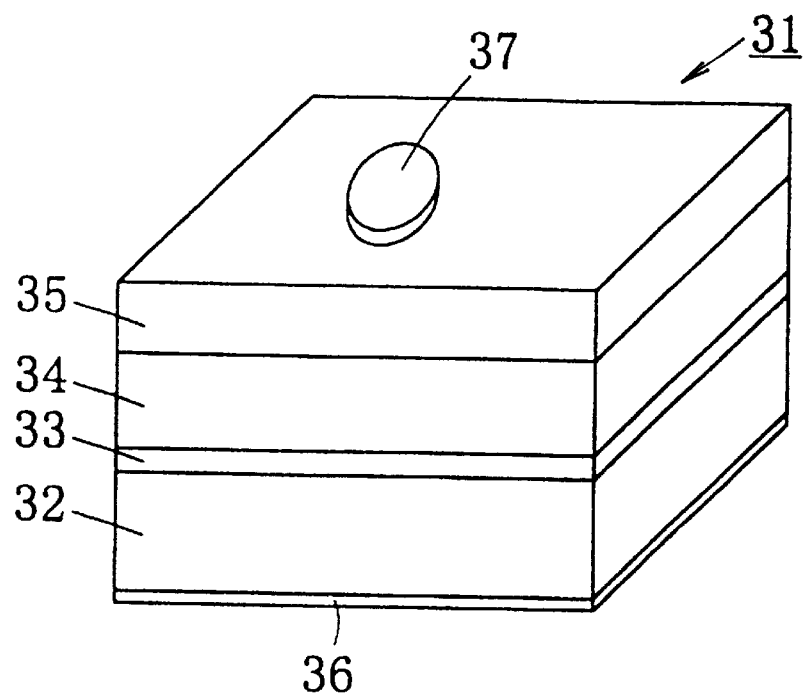
FIG. 5 is a perspective view which shows a structure of a semiconductor photonic device as another embodiment of the present invention.

The present invention is also applicable to other semiconductor photonic devices in addition to a semiconductor photonic device having a double hetero-junction structure using the InGaN layer 6 as shown in FIG. 1. For example, a semiconductor photonic device 31 shown in FIG. 5 may be acceptable, in which a ZnO buffer layer 33, an n-type GaN layer 34 and a p-type GaN layer 35 are deposited on an Si substrate 32, an n-type electrode 36 is formed on the lower surface of the Si substrate 32 and a p-type electrode 37 is provided on the p-type GaN layer 35. Although not shown in the drawing, a light emitting device having a structure in which a ZnO buffer layer, a low-temperature growth GaN buffer layer, an n-type GaN layer and a p-type GaN layer are deposited on a glass substrate may be acceptable. Additionally, as a substrate, a c-plane sapphire substrate may be used.

Figure 6:
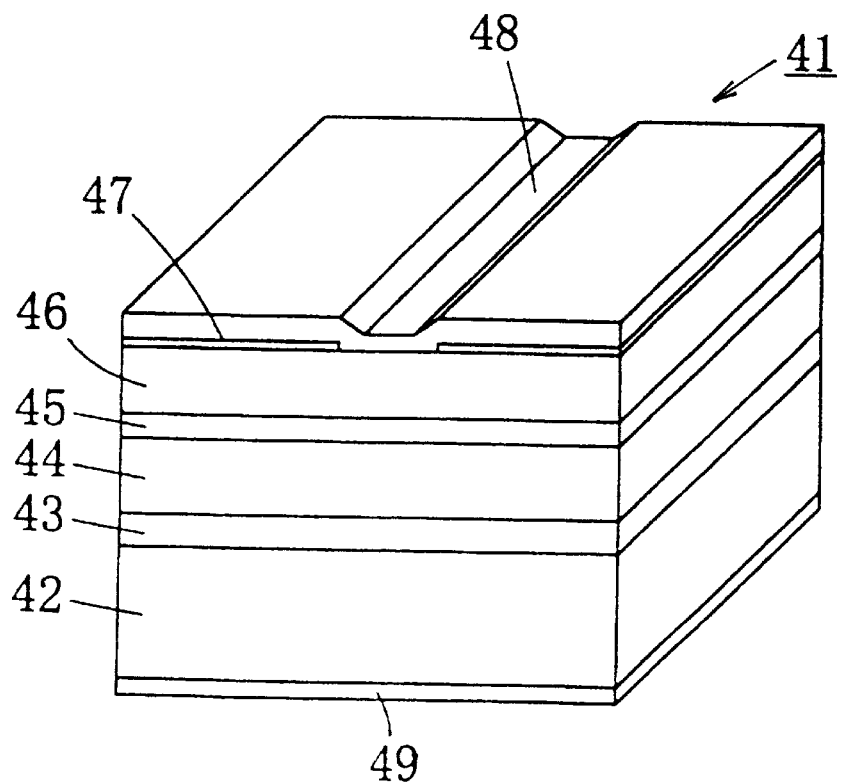
FIG. 6 is a perspective view which shows a structure of a semiconductor photonic device in yet another embodiment of the present invention.

Furthermore, as shown in FIG. 6, a semiconductor photonic device 41 such as a laser diode or a facet emitting light emitting diode may be acceptable, in which a ZnO buffer layer 43 is formed on an Si substrate 42, an n-type GaN cladding layer 44, a p-type GaN active layer 45 and a p-type GaN cladding layer 46 are deposited, an SiO$_2$ film 47 is formed in the region of the upper surface of the p-type GaN cladding layer 46 excluding a central area, a p-type electrode 48 is provided from on top of the SiO$_2$ film 47 to on the p-type GaN cladding layer 46 and an n-type electrode 49 is provided on the lower surface of the Si substrate 42.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A semiconductor photonic device comprising:
   a silicon substrate:
   a ZnO buffer layer on the substrate; and
   a semiconductor compound layer represented by In$_x$Ga$_y$Al$_z$N where x+y+z=1, $0 \leq x \leq 1$, $0 \leq y \leq 1$ and $0 \leq z \leq 1$ on the buffer layer,
   wherein the ZnO buffer has a thickness of about 7,000 Å or more and is oriented in a c-axis direction.

2. A semiconductor photonic device according to claim 1, wherein the ZnO buffer layer oriented in the c-axis direction has a rocking curve half-width of 2.5° or less.

3. In a method for forming a material for a semiconductor photonic device by forming a ZnO film oriented in the c-axis direction on a silicon substrate, the improvement which comprises causing the ZnO film thickness to be 7,000 Å or more, whereby a ZnO film having a rocking curve half-width of 2.5° or less is obtained.

4. In a method for forming a material for a semiconductor photonic device by forming a ZnO film oriented in the c-axis direction on a silicon substrate and then forming a semiconductor compound layer on the buffer layer, the improvement which comprises causing the ZnO film thickness to be 7,000 Å or more, whereby a ZnO film having a rocking curve half-width of 2.5° or less is obtained.

* * * * *